United States Patent [19]
Kim et al.

[11] Patent Number: 6,017,825
[45] Date of Patent: *Jan. 25, 2000

[54] ETCH RATE LOADING IMPROVEMENT

[75] Inventors: Sung Ho Kim, San Jose; David R-Chen Liu, Saratoga, both of Calif.

[73] Assignee: Lam Research Corporation, Fremont, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 08/624,301

[22] Filed: Mar. 29, 1996

[51] Int. Cl.$^7$ .................................................. H01L 21/00

[52] U.S. Cl. ...................... 438/720; 438/729; 438/742; 216/68

[58] Field of Search ................................. 156/345, 643.1, 156/646.1; 118/723 E, 723 I; 216/71, 68; 204/298.34; 438/720, 729, 742

[56] References Cited

U.S. PATENT DOCUMENTS

| | | | |
|---|---|---|---|
| 5,272,417 | 12/1993 | Ohmi | 156/345 X |
| 5,464,499 | 11/1995 | Moslehi et al. | 216/71 |
| 5,529,657 | 6/1996 | Ishii | 156/345 |
| 5,534,751 | 7/1996 | Lenz et al. | 156/345 X |
| 5,591,301 | 1/1997 | Grewal | 438/729 |
| 5,614,055 | 3/1997 | Fairbairn et al. | 156/345 |
| 5,685,941 | 11/1997 | Forster et al. | 156/345 |

*Primary Examiner*—Thi Dang
*Attorney, Agent, or Firm*—Beyer & Weaver LLP

[57] ABSTRACT

A method in a plasma processing system having a top electrode and a bottom electrode for etching through a portion of a selected layer of a layer stack of a wafer. The method includes the step of etching at least partially through the selected layer while providing a first radio frequency (RF) signal having a first RF frequency to the top electrode. The method further includes the step of providing a second RF signal having a second RF frequency lower than the first RF frequency to the bottom electrode.

16 Claims, 6 Drawing Sheets

ETCH RATE LOADING IMPROVEMENT

BACKGROUND OF THE INVENTION

The present invention relates to the fabrication of semiconductor integrated circuits (IC's) using plasma-enhanced semiconductor processes. More particularly, the present invention relates to methods and apparatuses for etching through a selected layer of an IC's layer stack during IC fabrication.

Figure 1:
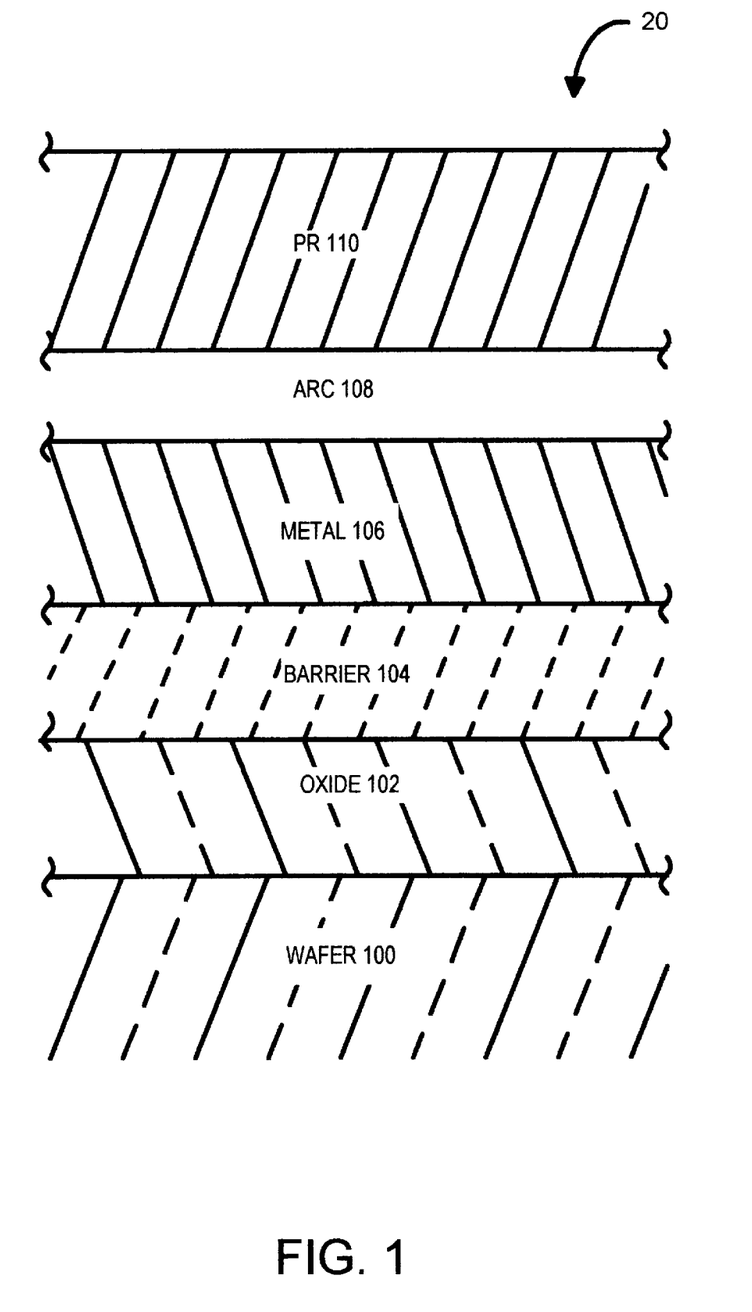
FIG. 1 illustrates a cross-section view of a layer stack, representing the layers formed during the fabrication of a typical semiconductor IC.

In semiconductor IC fabrication, devices such as component transistors are formed on a semiconductor wafer or substrate, which is typically made of silicon. Metallic interconnect lines, which are etched from a metallization layer disposed above the wafer, are then employed to couple the devices together to form the desired circuit. To facilitate discussion, FIG. 1 illustrates a cross-sectional view of a layer stack 20, representing the layers formed during the fabrication of a typical semiconductor IC. It should be noted that layer stack 20 is shown herein for ease of illustration and other additional layers above, below, or between the layers shown may be present depending on the desired end product. For example, a polysilicon or a nitride layer may be present if the desired end product is an MOS transistor. Further, not all of the shown layers need necessarily be present and some or all may be substituted by other different layers.

At the bottom of layer stack 20, there is shown a wafer 100. An oxide layer 102, typically comprising $SiO_2$, is formed above wafer 100. A barrier layer 104, typically formed of Ti, TiW, TiN or other suitable barrier materials, may be disposed between oxide layer 102 and a subsequently deposited metallization layer 106. Barrier layer 104, when provided, functions to prevent the diffusion of silicon atoms from oxide layer 102 into the metallization layer.

Metallization layer 106 typically comprises copper, aluminum or one of the known aluminum alloys such as Al—Cu, Al—Si, or Al—Cu—Si. For convenience, the metallization layer 106 is referred to herein as the aluminum layer although it should be understood that such a reference may include a layer consisting of any of the aforementioned aluminum alloys. The remaining two layers of FIG. 1, i.e., an anti-reflective coating (ARC) layer 108 and an overlaying photoresist (PR) layer 110, are then formed atop metallization layer 106. The ARC layer 108, typically comprising TiN or TiW, helps prevent light (e.g., from the lithography step that patterns the photoresist) from being reflected and scattered off the surface of the metallization layer 106 and may, in some cases, inhibit hillock growth. Photoresist layer 110 represents a layer of conventional photoresist material, which may be patterned for etching, e.g., through exposure to ultra-violet rays. The layers of layer stack 20 are readily recognizable to those skilled in the art and may be formed using any of a number of suitable and known deposition processes, including chemical vapor deposition (CVD), plasma-enhanced chemical vapor deposition (PECVD), and physical vapor deposition (PVD) such as sputtering.

To form the aforementioned metallic interconnect lines, a portion of the layers of the layer stack, including the metallization layer, e.g., metallization layer 106, are etched using a suitable photoresist technique. By way of example, one such photoresist technique involves the patterning of photoresist layer 110 by exposing the photoresist material in a contact or stepper lithography system, and the development of the photoresist material to form a mask to facilitate subsequent etching. Using an appropriate etchant, the areas of the metallization layer that are unprotected by the mask are then etched away, leaving behind metallization interconnect lines or features.

Figure 2:
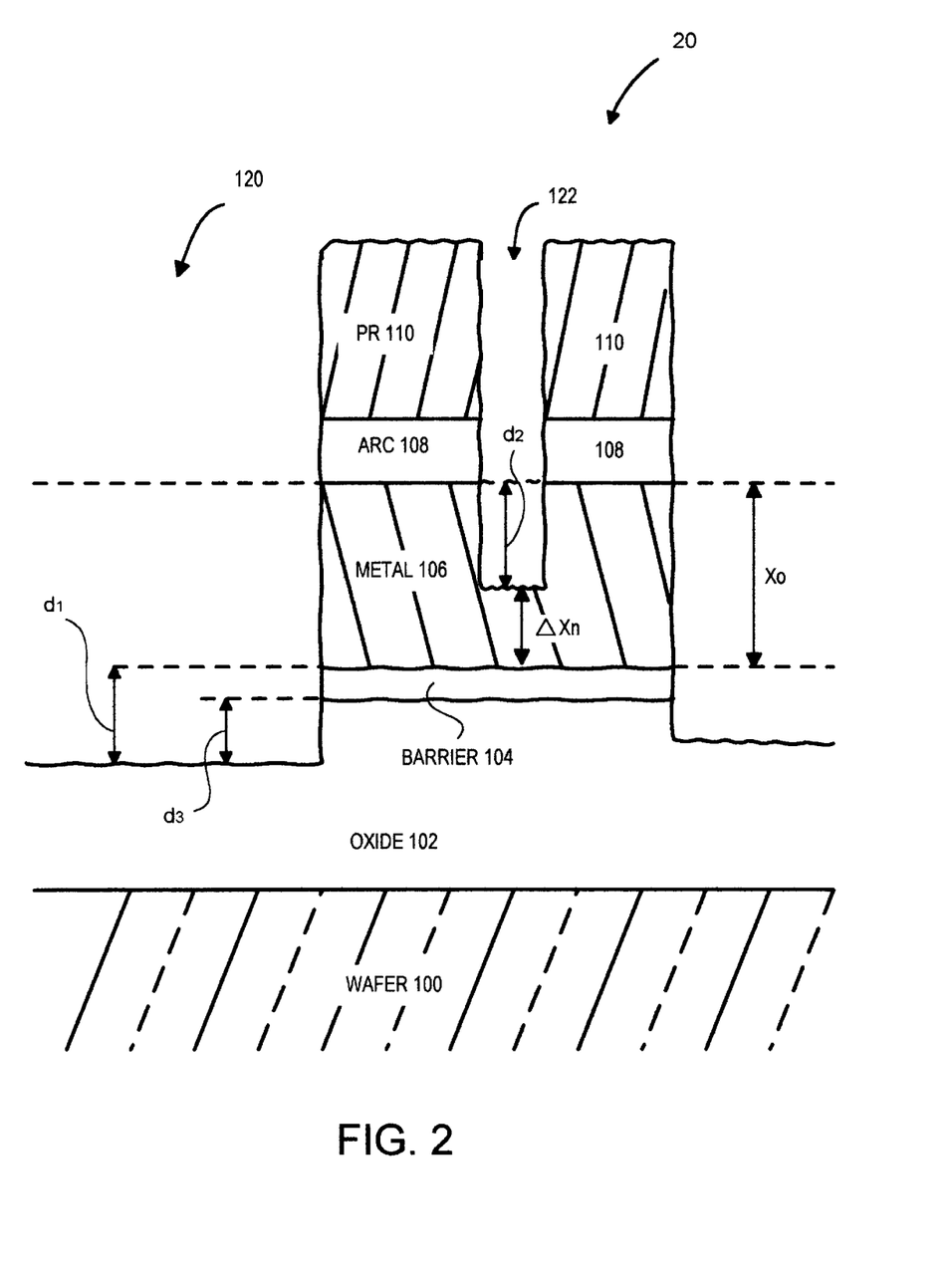
FIG. 2 illustrates a cross-section view of the layer stack of FIG. 1 after conventional etching is completed.

For illustrative purposes, FIG. 2 shows a cross-sectional view of layer stack 20 of FIG. 1 after conventional metal etching is completed. In this example, the metallic interconnect lines are represented by the unetched portions of metallization layer 106.

To achieve greater circuit density, modern IC circuits are scaled with increasingly narrower design rules. As a result, the feature sizes, i.e., the width of the interconnect lines or the spacings (e.g., trenches) between adjacent interconnect lines, have steadily decreased. By way of example, while a line width of approximately 0.8 microns ($\mu$m) is considered acceptable in a 4 megabit (Mb) dynamic random access memory (DRAM) IC, 256 Mb DRAM IC's preferably employ interconnect lines as thin as 0.25 microns or even thinner.

As the feature sizes shrink, it becomes increasingly difficult to achieve a uniform etch rate across the wafer. Typically, the etch rate in the narrow spacings is slower than that in wider trenches and/or open field regions. This phenomenon, referred herein as the loading in etch rates, may be a consequence of microloading and/or aspect ratio dependent etching (ARDE). Microloading refers primarily to the situation wherein the etch rate is smaller in areas where there is a high density of line spacings relative to the etch rate of identically sized trenches located in a less dense area. ARDE, on the other hand, refers primarily to the situation wherein variations in etch rates are observed among trenches that are located in areas of similar trench density and among trenches that have different aspect ratios. The loading in etch rates causes trenches to be formed in the layer stack at different rates. The loading in etch rates becomes more severe when trench widths fall below about 0.8 microns, and especially when trench widths fall below about 0.35 microns. As a result of the etch rate variations, by the time metal etching is complete in areas having a slow etch rate (e.g., in the narrower line spacings), overetching, i.e., the inadvertent removal of materials from underlying layers, may have already occurred in areas having a higher etch rate (e.g., the open field regions).

With reference to FIG. 2, area 120 represents an open field region where the metallization layer is overetched (by distance d1 or d3). Area 122 represents the region where the etch rate loading has the potential to occur. The metallization at the bottom of the trench is underetched by distance $\Delta X_n$ (or $X_0$-d2). If the etch rate variations are sufficiently large, it may not be possible, for some geometry, to etch though the target layer, e.g., the metal layer, in the narrower spacings before undue damage to the underlying layers in the open field regions occurs. For example, large etch rate variations may cause undue overetching and excessive oxide loss in area 120, rendering the wafer undergoing processing unsuitable for use in IC fabrication.

In view of the foregoing, what is desired is improved methods and apparatus for minimizing the loading in etch rates in the etching of selected layers of the layer stack.

SUMMARY OF THE INVENTION

The invention relates, in one embodiment, to a method in a plasma processing system having a top electrode and a bottom electrode for etching through a portion of a selected layer of a layer stack of a wafer. The method includes the step of etching at least partially through the selected layer while providing a first radio frequency (RF) signal having a first RF frequency to the top electrode. The method further includes the step of providing a second RF signal having a second RF frequency lower than the first RF frequency to the bottom electrode.

In another embodiment, the invention relates to an apparatus in a plasma processing system having a top electrode and a bottom electrode for etching through a portion of a metallization layer of a wafer layer stack. The apparatus includes a first radio frequency (RF) power source for providing a first RF signal having a first RF frequency to the top electrode. Further, the apparatus includes a second RF power source for providing a second RF signal having a second RF frequency lower than the first RE frequency to the bottom electrode during the etching.

In yet another embodiment, the invention relates to a method, in a plasma processing system having a top electrode and a bottom electrode for manufacturing an integrated circuit chip. The method includes the step of etching at least partially through a portion of a selected layer of a layer stack of a semiconductor wafer while providing a first radio frequency (RF) signal having a first RF frequency to the top electrode. Further, the method includes the step of providing a second RF signal having a second RF frequency lower than the first RF frequency to the bottom electrode.

These and other advantages of the present invention will become apparent upon reading the following detailed descriptions and studying the various figures of the drawings.

BRIEF DESCRIPTION OF THE DRAWINGS

Additional advantages of the invention will become apparent upon reading the following detailed description and drawings.

DETAILED DESCRIPTION OF THE INVENTION

An invention is described for minimizing, in a plasma processing chamber, the etch rate loading problem by supplying RF energy at a first frequency to the top electrode of the plasma processing system while providing the bottom electrode with an RF signal having a second RF frequency that is lower than the first frequency. Details regarding the top and bottom electrodes are explained in greater detail herein and particularly with reference to FIG. 3. In the following description, numerous specific details are set forth in order to provide a thorough understanding of the present invention. It will be obvious, however, to one skilled in the art, that the present invention may be practiced without some or all of these specific details. In other instances, well known process steps have not been described in detail in order not to unnecessarily obscure the present invention.

In a preferred embodiment, the inventive dual frequency etch technique is employed in a TCP™ 9600 SE plasma reactor, which is available from Lam Research Corporation of Fremont, Calif., although, as mentioned above, any other conventional and suitable plasma processing systems may well be employed. Note that the above is true irrespective whether energy to the plasma is delivered through capacitively coupled parallel electrode plates, through electron cyclotron resonance (ECR) microwave plasma sources, through inductively coupled RF sources such as helicon, helical resonators, and transformer coupled plasma. ECR and TCP™ (transformer coupled plasma) processing systems, among others, are readily available commercially. TCP™ systems are available from, for example, the aforementioned Lam Research Corporation.

Figure 3:
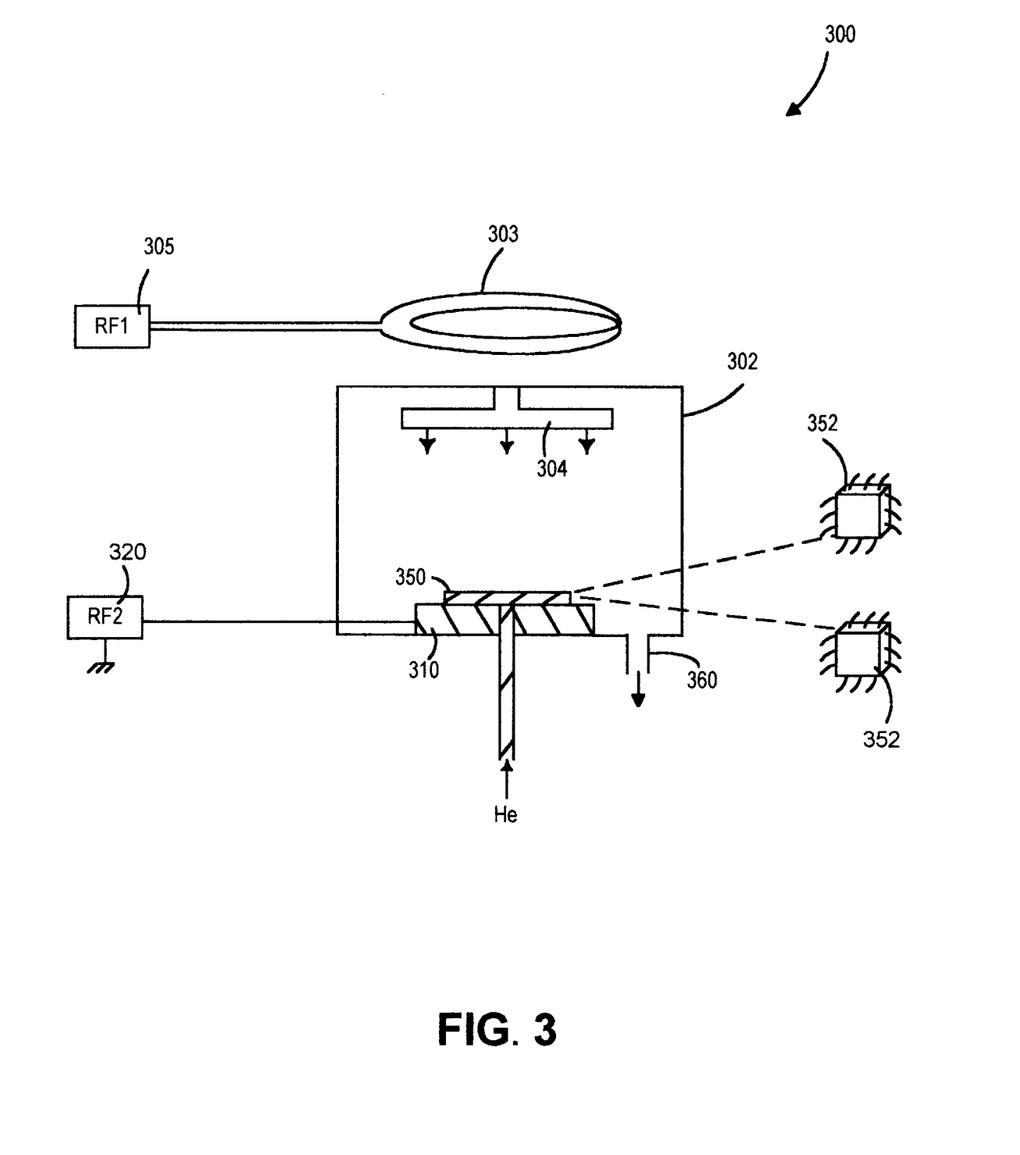
FIG. 3 is a simplified schematic diagram of a plasma reactor that may be suitably employed with the inventive dual-frequency etch technique.

FIG. 3 illustrates a simplified schematic of the TCP™ 9600 SE plasma reactor, including wafer 350 and integrated circuit chips 352, which are fabricated from dies cut from wafer 350 after the wafer is etched according to the inventive dual-frequency etch technique and processed in conventional post-etch steps. Referring to FIG. 3, a wafer reactor 300 includes a plasma processing chamber 302. Above chamber 302, there is disposed a top electrode 303, which is implemented by a coil in the example of FIG. 3. Coil 303 is energized by an upper RF generator 305 via a matching network (not shown in FIG. 3), which supplies coil 303 with RF energy at a first frequency, e.g., 13.56 MHz.

Within chamber 302, there is provided a shower head 304, which preferably includes a plurality of holes for releasing gaseous source materials, e.g., the etchant source gases, into the RF-induced plasma region between itself and a wafer 350. The gaseous source materials may also be released from ports built into the walls of the chamber itself. Wafer 350 is introduced into chamber 302 and disposed on a chuck 310, which acts as a bottom electrode and is preferably biased by another radio frequency generator 320 (also typically via a matching network). As employed herein, the term "bottom electrode" does not connote any particular spatial limitation and refers to the electrode in the plasma processing chamber on which the wafer is disposed. Radio frequency generator 320, in accordance with one aspect of the present invention, supplies RF energy to bottom electrode 310 at a second frequency that is lower than the frequency supplied by the upper RF generator 305, i.e., the first frequency. By way of example, RF generator 320 may be implemented by a fixed-frequency RF generator or more preferably a variable-frequency RF generator, which is capable of outputting a wide range of RF frequencies responsive to a control signal.

Helium cooling gas is introduced under pressure (e.g., about 5–10 Torr in one embodiment) between chuck 310 and wafer 350 to act as a heat transfer medium for accurately controlling the wafer's temperature during processing to ensure uniform and repeatable etching results. During plasma etching, the pressure within chamber 302 is preferably kept low by withdrawing gas through port 360, e.g., between about 8 to 22 mTorr in one embodiment. A plurality of heaters (omitted from FIG. 3 to simplify the illustration) may be provided to maintain a suitable chamber temperature for etching (e.g., about 70° C. in one embodiment). To provide a path to ground, the chamber wall of chamber 302 is typically grounded.

In accordance with one aspect of the present invention, it has been realized that the etch rate loading may be minimized by improving the ion directionality toward the surface of the wafer during etching. Improved ion directionality tends to advantageously increase the ion flux at the bottom of the narrow trenches to improve the etch rate in these areas.

Figure 4:
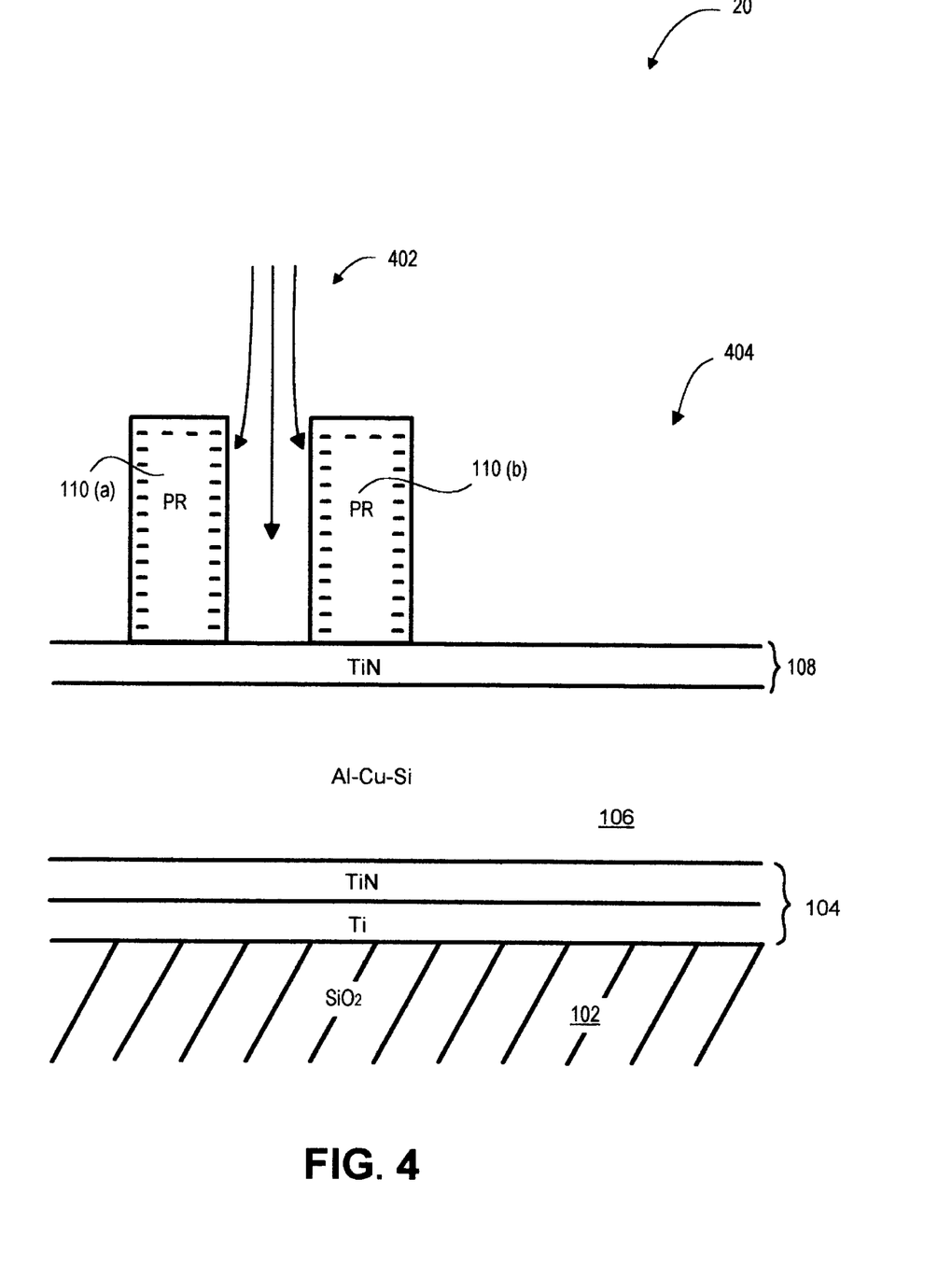
FIG. 4 illustrates a portion of a layer stack, including the photoresist (PR) layer, which has been patterned prior to metal etching.

To provide a more thorough understanding of the present invention, it is useful to discuss some of the mechanisms that affect the narrow trench etch rate in the prior art. To facilitate discussion, FIG. 4 illustrates a portion of layer stack 20, including photoresist (PR) layer 110, which has been patterned prior to metal etching. Other layers of FIG. 4 correspond to the layers of FIG. 1 having like reference numbers. When a plasma is generated in a plasma processing chamber out of plasma etchant sources, such as $BCl_3/Cl_2$, the patterned photoresist columns become negatively charged by the fast moving positive reactive ion species, e.g., $Cl^+$. The negatively charged photoresist columns, e.g., columns 110 (a) and 110(b), tend to attract and alter the directionality of the positively charged reactive ion species in the narrow spaces, e.g., narrow trench 402.

Unless this ion directionality is improved, a significant number of positively charged reactive ions may fail to reach the bottom of the narrow spaces to perform their intended etching role. Since ion directionality is not so altered in the wider spaces or in the open field regions, e.g., region 404 of FIG. 4, (due to the lower density of negatively charged photoresist columns), the ion flux at the surface of the wafer in these wider spaces or in the open field regions tends to be higher than that in the narrow spaces. Consequently, etching may occur at a faster rate in the wider spaces and/or open field regions. This situation leads to an imbalance in the etch rates between these two regions occurs, i.e., causing etch rate loading.

The presence of adjacent photoresist columns also affect the narrow trench etch rate in a different way. During etching, the bombarding ions tend to flake off photoresist fragments from the photoresist features. Some of the polymers that result are then deposited on the surface of the wafer. Since the narrow spacings are surrounded by photoresist columns and/or have a higher density of photoresist columns in general, more polymer deposition tends to occur in the narrow spacings relative to the open field regions, where there are fewer photoresist columns. The higher rate of polymer deposition in the narrow spacings further contributes to the etch rate differential between these spacings, i.e., it contributes to the loading in etch rates.

With improved ion directionality toward the wafer surface, as is done in accordance with one aspect of the present invention, it is believed that the positively charged reactive ion species are less likely to be attracted to the negatively charged photoresist sidewalls. Consequently, the ion flux at the bottom of the narrow trenches tends to increase, leading to a higher etch rate in these narrow spacings to better balance the etch rates between the narrow and wide spacings, i.e., reduce the etch rate loading.

Figure 5A:
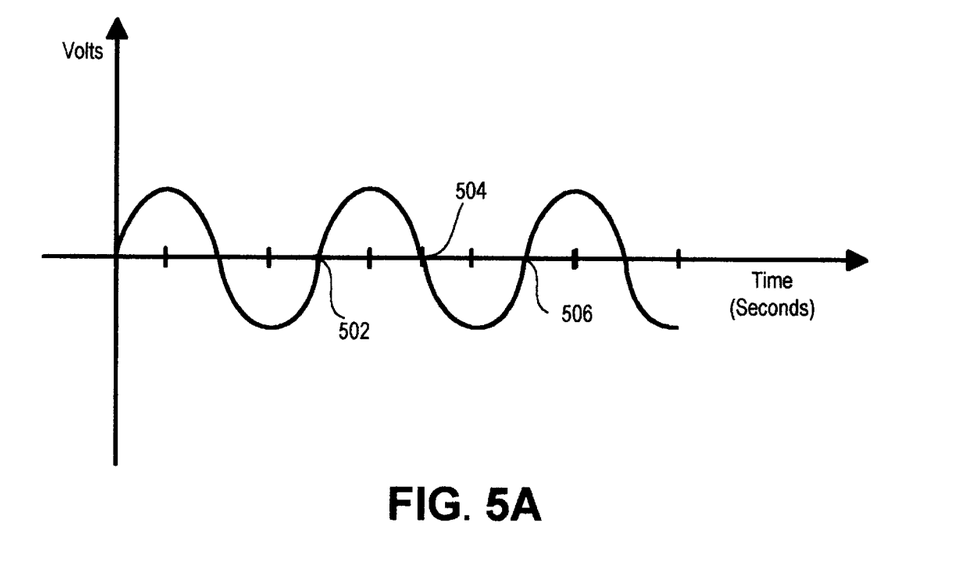
FIG. 5A is a plot of a sinusoidal wave, representing a typical 13.56 MHz RF signal that may be supplied to both the top and bottom electrodes in the prior art.

For illustrative purposes, FIG. 5A is a plot of a sinusoidal wave, representing a typical 13.56 MHz RF signal that may be supplied to both the top and bottom electrodes in the prior art. With reference to FIG. 5A, the positive cycle occurs between points 502 and 504 while the negative cycle occurs between points 504 and 506. At this relatively high frequency, e.g., about 13.56 MHz, alternating positive and negative cycles occur too rapidly for typical ion species, which have nontrivial mass and inertia, to respond to each cycle individually.

To achieve improved ion directionality, the RF signal is supplied, in accordance with one aspect of the invention, to the bottom electrode at a frequency level that is lower than the frequency level of the RF signal supplied to the top electrode. This is in sharp contrast to typical prior art etch techniques wherein both the top and bottom electrodes are energized by RF signals having substantially the same RF frequency. By way of example, the RF signal supplied to the top electrode may be fixed at a typical RF frequency, e.g., about 13.56 MHz, while the frequency of the RF signal supplied to the bottom electrode is advantageously lowered to a second frequency that is lower than the top electrode frequency. This lower frequency of the bottom electrode RF signal is preferably one that is sufficiently slow to allow the reactive ion species, e.g., $Cl^+$, to respond to the effects of the positive and negative cycles individually.

Figure 5B:
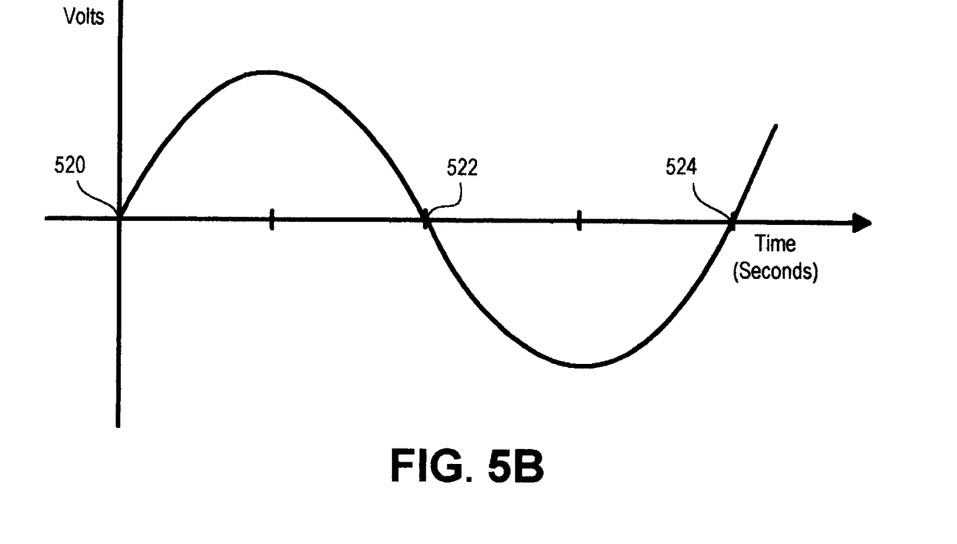
FIG. 5B shows an exemplary RF signal having a frequency in the range suitable for energizing the bottom electrode in accordance with the inventive dual-frequency etch technique.

FIG. 5B shows an exemplary RF signal having a frequency in the range suitable for energizing the bottom electrode in accordance with the inventive dual-frequency etch technique. If the RF signal supplied to the top electrode is at about 13.56 MHz, the bottom electrode RF signal may have a frequency of, for example, about 4 MHz. When the frequency of the bottom electrode RF signal is reduced, the duration of its individual positive and negative cycles are extended. Due to the longer positive cycle of the bottom electrode RF signal, the reactive ion species now have a longer time to accelerate before the onset of the negative cycle. For example, the acceleration time is about three times longer at 4 MHz than at 13.56 MHz.

With a longer acceleration time, reactive ion species have a longer period of time to acquire their bombardment energy through acceleration. The increased acquired energy helps speed the reactive ion species toward the wafer surface, thereby improving ion directionality by reducing the number of reactive ions that may be attracted to the negatively charged photoresist sidewalls. With more reactive ion species reaching the bottom of the narrow trenches, the ion flux at these trench bottoms tends to increase, thereby improving the etch rates in these narrow trench regions.

With a longer acceleration time, the reactive ion species also tend to bombard the wafer surface with higher energy to physically etch away the polymer deposition that exists at the bottom of the narrow trenches. The efficient physical etching of the polymer deposition at the bottom of the narrow trenches by the higher energy reactive ion species represents another mechanism for reducing the etch rate loading in the present invention.

The higher energy acquired by the reactive ion species during the longer acceleration time may, however, cause excessive erosion of the protective photoresist columns that have been intentionally left on the wafer by the patterning step to protect underlying features during etching. If an excessive amount of protective photoresist is physically bombarded away, unintended damage to these underlying features may result. In accordance with one aspect of the present invention, the amount of power supplied to the bottom electrode is preferably limited to a power range that is suitable for moderating the physical bombardment from the high energy reactive ion species. The exact range of the bottom electrode RF power depends on the composition of the layer undergoing etching, its deposition conditions, the specific plasma processing system employed, the size of the wafer, and the like. By simultaneously reducing the frequency of the bottom electrode RF signal and the amount of power supplied to the bottom electrode, a balance is struck between improved ion directionality and reduced erosion of the protective photoresist layer.

In accordance with yet another aspect of the present invention, it is discovered that the amount of RF power supply to the bottom electrode has a lower threshold limit, the exact value of which depends, at least in part, on the frequency of the bottom electrode RF signal. Reducing the RF power level below the lower threshold limit may result in reverse microloading, i.e., the etch rate in the narrow spacings may be faster than that in the wider trenches and/or open field regions.

It is believed that the reverse microloading phenomenon occurs when the bottom electrode RF power is too low to provide the reactive ion species with sufficient energy to etch in the wide trenches and/or open field regions. In the narrow spacings, however, it is believed that some of the positively charged reactive ion species may continue to be attracted toward the wafer surface by the negatively charged adjacent photoresist columns. Consequently, etching in the narrow spacings may go on despite the fact that the bottom RF power is too low to cause etching in the wider trenches and/or open field regions. Note that this acceleration mechanism does not exist in the wider trenches and/or open field regions since there is, by definition, little if any photoresist columns in these areas. By way of example, such reverse microloading has been observed in the TCP™ 9600 plasma etching system, available from Lam Research Corporation of Fremont, Calif., while etching an aluminum-containing metallization layer on a 6-inch wafer with about 100 W of RF power at 13.56 MHz supplied to the top (TCP) electrode and about 50 W of RF power at 400 KHz supplied to the bottom electrode.

It is believed that the longer negative cycle of the bottom electrode RF signal may also reduce the wafer bias voltage somewhat, possibly exerting a braking effect on the acceleration of the reactive ion species. Although there may be less ion flux at the bottom of the trench during the negative cycle, it is believed this has a minimal effect on the etch rate since the reactive neutrals, which comprise a high percentage of the reactive species, e.g., up 90–95% in some cases, are not repelled by the wafer during the negative cycle. Consequently, etching by the reactive neutrals still proceed in the narrow trenches during the negative cycle of the bottom electrode RF signal.

Table 1 shows the power ranges that may be suitable for etching an aluminum-containing metallization layer at various bottom electrode RF frequencies. In this experiment, the aforementioned TCP™ 9600 plasma etching system is employed to etch an aluminum-containing metallization layer of a 8-inch wafer. $Cl_2$ and $BCl_3$ at flow rates of 100 sccm and 50 sccm respectively were employed as the principal etchant source gases. The top TCP electrode is supplied with 500 watts of RF energy at about 13.56 MHz. The approximate corresponding bottom electrode RF power ranges for various bottom electrode RF frequencies are shown.

TABLE 1

| Bottom Electrode RF Frequency | Approximate Bottom Electrode RF Power Range |
| --- | --- |
| 400 kHz | 50–175 kW |
| 1 MHz | 75–200 kW |

TABLE 1-continued

| Bottom Electrode RF Frequency | Approximate Bottom Electrode RF Power Range |
| --- | --- |
| 2 MHz | 100–250 kW |
| 4 MHz | 125–275 kW |

In the experiment described above, it has been found that etch rate loading is minimized when the bottom electrode is supplied with an RF signal having a frequency range between about 400 kHz to about 4 MHz, more preferably between about 2 MHz to about 4 MHz.

Figure 6:
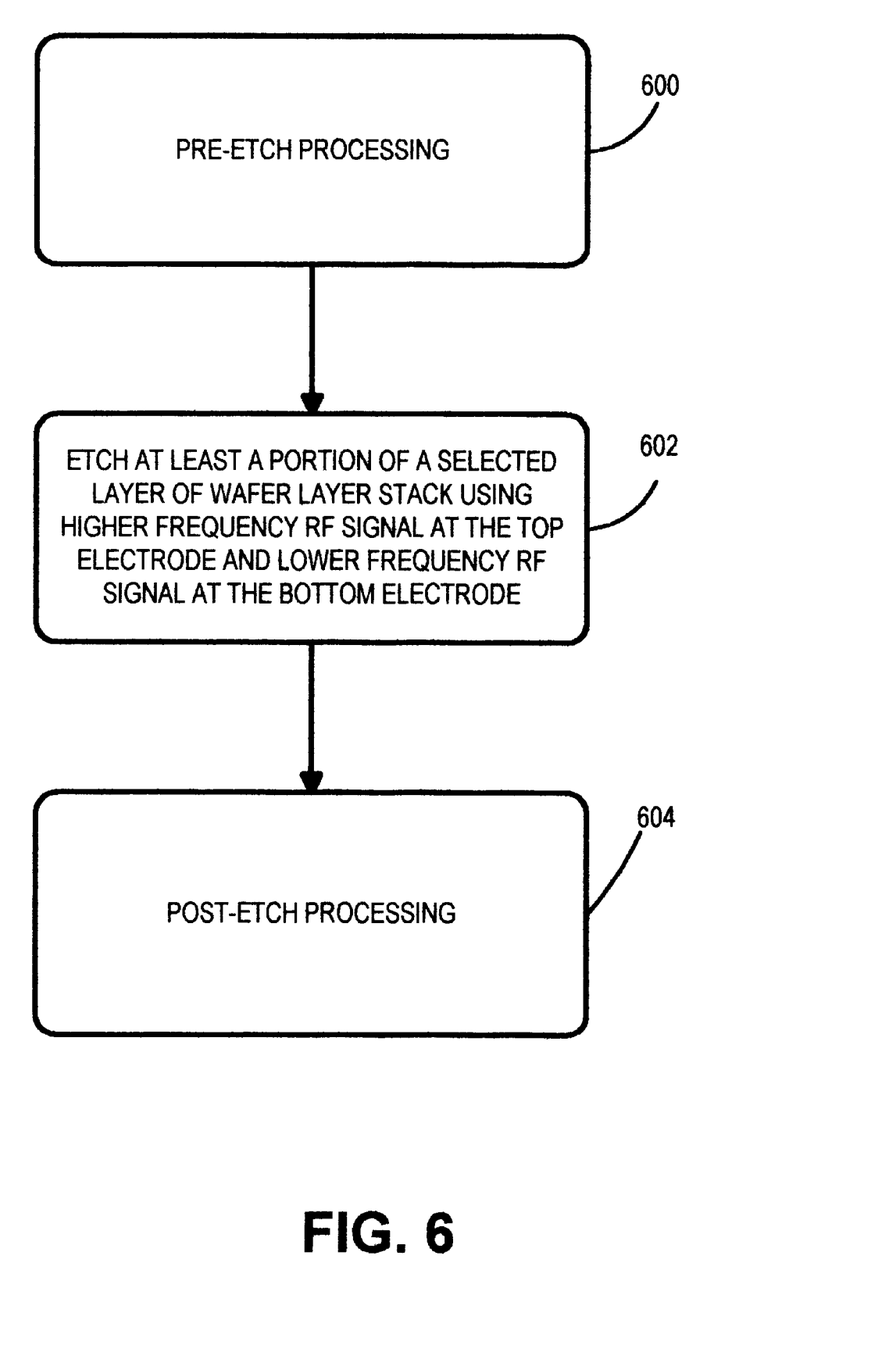
FIG. 6 shows, in accordance with one aspect of the present invention, the steps involved in the inventive dual frequency etch process.

FIG. 6 shows, in accordance with one aspect of the present invention, the steps involved in the inventive dual frequency etch process. In step 600, a wafer is prepared for etching in a conventional pre-etch step. The pre-etch step may include, for example, clamping the wafer onto the chuck, stabilizing the pressure within the plasma processing chamber, and introducing helium cooling gas to the wafer backside to facilitate heat transfer between the wafer and the chuck.

In step 602, at least a portion of a selected layer of the wafer layer stack is etched using the inventive dual-frequency etching technique. In the example discussed herein, the selected layer is a metallization layer. It is believed that the inventive dual frequency etching technique also reduces the etch rate loading when employed with appropriate conventional chemistries to etch polysilicon, nitride, oxide, or any other layer of the wafer layer stack.

In this step, the RF signal supplied to the top electrode is maintained at a first, higher frequency while the bottom electrode is supplied with a second, lower frequency RF signal. In one embodiment, the frequency of the top electrode RF signal is about 13.56 MHz while the frequency of the bottom electrode RF signal is lower than the top electrode RF frequency, e.g., preferably from about 400 kHz to about 4 MHz, and more preferably from about 1 MHz to about 2 MHz to etch an aluminum-containing metallization layer in a TCP™ 9600 SE plasma processing system using $BCl_3/Cl_2$. Also in this step 602, the lower electrode RF power range is preferably adjusted as mentioned herein to balance increased ion directionality with improved protection of the photoresist features. Suitable ranges for various lower electrode RF frequencies for a particular etch experiment is illustrated in Table 1 above.

In step 604, the wafer may undergo additional processing steps to fabricate the desired components as well as post-etch processing steps that are conventional in nature. Thereafter, the finished wafer may be cut into dies, which may then be made into IC chips. The resulting IC chip, e.g., IC chips 352 of FIG. 3, may then be incorporated in an electronic device, e.g., any of the of well known commercial or consumer electronic devices, including digital computers.

While this invention has been described in terms of several preferred embodiments, there are alterations, permutations, and equivalents which fall within the scope of this invention. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

What is claimed is:

1. In an inductively coupled plasma processing system having a plurality of electrodes, said plurality of electrodes consisting essentially of two electrodes: a top electrode and a bottom electrode, said top electrode having a coil configuration, a method for reducing etch rate loading while etching through a portion of a selected layer of a layer stack of a wafer, said method comprising:

placing said wafer into said inductively coupled plasma processing system;

etching at least partially through said selected layer while:
providing a first radio frequency (RF) signal having a first RF frequency to said top electrode, said first RF frequency being about 13.56 MHz;
providing a second RF signal having a second RF frequency lower than said first RF frequency to said bottom electrode, said second RF frequency has a range of about 400 kHz to about 4 MHz, said second RF frequency causing said selected layer to be etched at an accelerated rate in narrow regions of said selected layer, thereby lowering said etch rate loading; and
providing RF power having an RF power range of about 50 kW to about 275 kW to said bottom electrode, said RF power range representing a range that does not result in excessive erosion of protective photoresist features of said layer stack by said reactive ion species.

2. The method of claim 1 wherein said second RF signal has a positive cycle, reactive ion species in said plasma processing system being accelerated toward said wafer for a longer period of time than said reactive ion species would have been if said second RF signal had said first RF frequency.

3. The method of claim 1 wherein said selected layer comprises aluminum.

4. The method of claim 3 wherein said wafer is etched with $Cl_2/BCl_3$ etchant source gases.

5. The method of claim 1 wherein said second RF frequency is about 4 MHz.

6. The method of claim 1 wherein said selected layer represents a metallization layer comprising aluminum.

7. The method of claim 1 wherein said RF power range is between about 50 kW to about 200 kW, and said second RF frequency is about 400 kHz to about 1 MHz.

8. The method of claim 1 wherein said RF power range is between about 50 kW to about 250 kW, and said second RF frequency is about 400 kHz to about 2 MHz.

9. The method of claim 1 wherein said RF power range is between about 75 kW to about 250 kW, and said second RF frequency is about 1 MHz to about 2 MHz.

10. In an inductively coupled plasma processing system having a plurality of electrodes, said plurality of electrodes consisting essentially of two electrodes: a top electrode and a bottom electrode, said top electrode having a coil configuration, a method for reducing etch rate loading during the manufacture of an integrated circuit chip, comprising:

placing a semiconductor wafer in said inductively coupled plasma processing system;

etching at least partially through a portion of a selected layer of a layer stack of said semiconductor wafer while:
providing a first radio frequency (RF) signal having a first RF frequency to said top electrode, and
providing a second RF signal having an RF power range of about 50 kW to about 275 kW and a second RF frequency lower than said first RF frequency to said bottom electrode, said second RF frequency has a range of about 400 kHz to about 4 MHz, said second RF frequency causing said selected layer to be etched at an accelerated rate in narrow regions of said selected layer, thereby lowering said etch rate loading.

11. The method of claim 10 wherein said selected layer comprises aluminum and said wafer is etched with $Cl_2/BCl_3$ etchant source gases.

12. The method of claim 11 wherein said first RF frequency is at about 13.56 megahertz.

13. In an inductively coupled plasma processing system having a top electrode and a bottom electrode, said top electrode having a coil configuration, a method for improving etch rate loading while etching through a portion of a selected layer of a layer stack disposed above a substrate, said method comprising:

placing said substrate in said inductively coupled plasma processing system;

etching at least partially through said selected layer while:
providing a first radio frequency (RF) signal having a first RF frequency to said top electrode, and
providing a second RF signal having an RF power range of about 50 kW to about 275 kW and a second RF frequency lower than said first RF frequency to said bottom electrode, said second RF frequency has a range of about 400 kHz to about 4 MHz, said second RF frequency causing said selected layer to be etched at an accelerated rate in narrow regions of said selected layer, thereby lowering said etch rate loading.

14. The method of claim 13 wherein said second RF signal has a positive cycle, reactive ion species in said plasma processing system being accelerated toward said substrate for a longer period of time than said reactive ion species would have been if said second RF signal had said first RF frequency.

15. The method of claim 13 wherein said selected layer comprises aluminum, said selected layer being etched with $Cl_2/BCl_3$ etchant source gases.

16. The method of claim 15 wherein said second RF frequency has a range between about 2 MHz and 4 MHz.

* * * * *